US010566369B2

(12) United States Patent
Tan et al.

(10) Patent No.: US 10,566,369 B2
(45) Date of Patent: Feb. 18, 2020

(54) IMAGE SENSOR WITH PROCESSOR PACKAGE

(71) Applicant: UTAC Headquarters Pte. Ltd., Singapore (SG)

(72) Inventors: Tim Thian Hwee Tan, Singapore (SG); Boon Pek Liew, Singapore (SG); Chee Kay Chow, Singapore (SG); Teddy Joaquin Carreon, Singapore (SG)

(73) Assignee: UTAC Headquarters Pte. Ltd., Singapore (SG)

( * ) Notice: Subject to any disclaimer, the term of this patent is extended or adjusted under 35 U.S.C. 154(b) by 13 days.

(21) Appl. No.: 15/839,884

(22) Filed: Dec. 13, 2017

(65) Prior Publication Data
US 2018/0182801 A1 Jun. 28, 2018

Related U.S. Application Data

(60) Provisional application No. 62/438,446, filed on Dec. 22, 2016.

(51) Int. Cl.
*H01L 27/146* (2006.01)
*H01L 23/498* (2006.01)
(Continued)

(52) U.S. Cl.
CPC ...... *H01L 27/14634* (2013.01); *H01L 21/561* (2013.01); *H01L 21/565* (2013.01); *H01L 23/315* (2013.01); *H01L 23/3128* (2013.01); *H01L 23/49811* (2013.01); *H01L 23/49822* (2013.01); *H01L 23/49838* (2013.01); *H01L 27/1469* (2013.01); *H01L 27/14618* (2013.01); *H01L 27/14636* (2013.01); *H01L 24/32* (2013.01); *H01L 24/48* (2013.01); *H01L 24/73* (2013.01); *H01L 24/81* (2013.01); *H01L 24/85* (2013.01); *H01L 2224/16225* (2013.01); *H01L 2224/32225* (2013.01);
(Continued)

(58) Field of Classification Search
CPC ....... H01L 2924/00014; H01L 2924/00; H01L 2224/48091; H01L 2924/181; H01L 2924/00012; H01L 2224/73265
See application file for complete search history.

(56) References Cited

U.S. PATENT DOCUMENTS 6,559,539 B2  5/2003  Tu et al.
6,661,089 B2  12/2003 Huang
(Continued)

FOREIGN PATENT DOCUMENTS

CN  105448944 A  3/2016
GB    2374725 A  10/2002

*Primary Examiner* — Tony Tran
(74) *Attorney, Agent, or Firm* — Horizon IP PTE LTD.

(57) ABSTRACT

A semiconductor package and a method for forming a semiconductor package are disclosed. The semiconductor package includes a multi-layer package substrate having interconnect structures embedded therein. A sensor chip having an image sensing element is disposed on a top surface of the package substrate, and an integrated circuit is mounted to a bottom surface of the package substrate. The integrated circuit is a flip-chip assembly. The sensor chip is electrically connected to the integrated circuit. An adhesive material bonds a transparent covering member to the sensor chip to enclose the image sensing element.

20 Claims, 15 Drawing Sheets

(51) Int. Cl.
*H01L 23/31* (2006.01)
*H01L 21/56* (2006.01)
*H01L 23/00* (2006.01)

(52) U.S. Cl.
CPC ............... *H01L 2224/48106* (2013.01); *H01L 2224/48227* (2013.01); *H01L 2224/73265* (2013.01); *H01L 2224/81005* (2013.01); *H01L 2224/85005* (2013.01)

(56) References Cited

U.S. PATENT DOCUMENTS

| | | |
|---|---|---|
| 6,680,525 B1 | 1/2004 | Hsieh et al. |
| 7,259,042 B2 | 8/2007 | Tsai et al. |
| 2017/0345864 A1* | 11/2017 | Kinsman ............. H01L 21/4853 |
| 2018/0069163 A1* | 3/2018 | Clark ...................... H01L 31/00 |

* cited by examiner

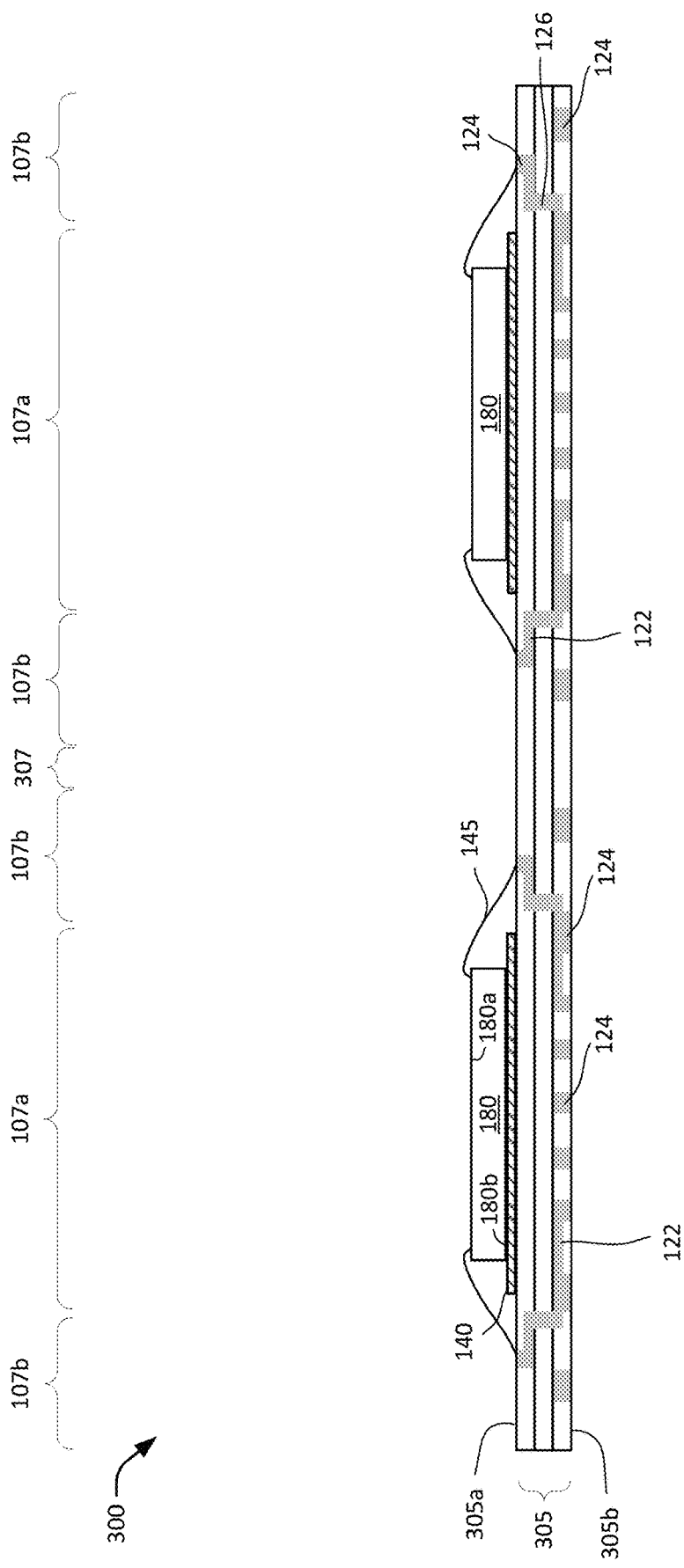

IMAGE SENSOR WITH PROCESSOR PACKAGE

CROSS-REFERENCE TO RELATED APPLICATION

This application claims the benefit of U.S. Provisional Application No. 62/438,446 titled "Image Sensor with Processor Package" filed on Dec. 22, 2016, which is incorporated herein by reference in its entirety for all purposes.

FIELD OF THE INVENTION

The present invention relates to a semiconductor package and its manufacturing method. In particular, the present invention is directed to a package structure in which a semiconductor chip and a sensor chip are integrally packaged onto a package substrate to provide a parallel processing architecture.

BACKGROUND

Sensing devices generally include sensor chips used for receiving non-electrical signals from the surrounding environment. A sensor chip converts the non-electrical signals received into electrical signals that are transmitted to a printed circuit board. The non-electrical signals received may include audio, optical, pressure and electromagnetic radiation signals, depending on the type of sensor chip used. The printed circuit board electrically connects the sensor chip to other integrated circuits to possess the desired function. For example, an image sensor chip may be electrically connected to a semiconductor chip, such as a microprocessor, to process the electrical signals generated by the sensor chip.

As autonomous technology advances, there is an increasing desire to incorporate more sensor chips within sensing devices to enable better analysis of the surrounding environment. However, conventional sensing devices are configured with a central processing architecture, which requires multiple sensor chips to be connected to a common semiconductor chip for signal processing. A single semiconductor chip possesses limited throughput. Moreover, conventional sensor chips, as well as the various integrated circuits mating with the sensor chip, are individually packaged. Accordingly, a plurality of substrates and package bodies have to be used, thereby increasing manufacturing costs and footprint of the printed circuit board.

From the foregoing discussion, there is a desire to provide an improved and simplified package structure for sensor chips. It is also desirable to provide methods to integrally package sensor chips with other integrated circuits.

SUMMARY

Embodiments generally relate to a semiconductor package and methods for forming a semiconductor package. In one embodiment, a semiconductor package defined with a die region and a non-die region surrounding the die region is disclosed. The semiconductor package comprises a multi-layer package substrate. The package substrate comprises a top substrate surface and a bottom substrate surface. Conductive structures are embedded in the different non-conductive layers of the package substrate. For example, contact pads are exposed in openings of the top and bottom substrate surfaces. A photosensitive chip is attached to the top substrate surface in the die region of the semiconductor package. The photosensitive chip is electrically connected to the contact pads exposed in the top substrate surface. A transparent covering member is attached to a top surface of the photosensitive chip. The transparent covering member partially overlaps a peripheral region defined on the top surface of the photosensitive chip. An integrated circuit is mounted on the bottom substrate surface in the die region. The integrated circuit underlaps the photosensitive chip and is electrically connected to contact pads exposed in the bottom substrate surface in a flip-chip manner. A plurality of package contacts protrude from the bottom substrate surface in the non-die region. The package contacts are coupled to the contact pads exposed in the bottom substrate surface.

In another embodiment, a semiconductor package having a laminate package substrate is disclosed. The semiconductor package is defined with a die region and a non-die region surrounding the die region. The laminate package substrate comprises a top substrate surface and a bottom substrate surface. Conductive structures are embedded in the different non-conductive layers of the laminate package substrate. For example, contact pads are exposed in openings of the top and bottom substrate surfaces. A sensor chip is mounted on the top substrate surface in the die region. The sensor chip is electrically connected to the contact pads exposed in the top substrate surface. A transparent covering member is disposed directly over a sensing element of the sensor chip. The transparent covering member partially overlaps a peripheral region defined on the top surface of the sensor chip. An integrated circuit is disposed on the bottom substrate surface in the die region. The integrated circuit underlaps the sensor chip and is electrically connected to contact pads exposed in the bottom substrate surface in a flip-chip manner. A plurality of package contacts corresponding to metal bumps protrude from the bottom substrate surface in the non-die region. The package contacts are coupled to the contact pads exposed in the bottom substrate surface. An encapsulant encapsulates the sensor chip. The encapsulant covers sidewalls of the sensor chip and contacts sidewalls of the covering member without overlapping the covering member.

In yet another embodiment, a method for forming a semiconductor package is disclosed. The method includes providing a laminate package substrate having a top and a bottom non-conductive substrate layer. The top substrate layer defines a top substrate surface and the bottom substrate layer defines a bottom substrate surface of the laminate package substrate. The laminate package substrate is defined with a die region and a non-die region surrounding the die region. Conductive structures are embedded in the different non-conductive layers of the laminate package substrate. For example, contact pads are exposed in openings of the top and bottom substrate surfaces. The laminate package substrate comprises contact pads exposed in openings of the top and bottom substrate surfaces. A sensor chip is mounted on the top substrate surface in the die region. Wire bond connections are formed to electrically connect the sensor chip to contact pads exposed in openings of the top substrate surface. A covering member is mounted on the sensor chip. The covering member partially overlaps a peripheral region defined on a top surface of the sensor chip. An encapsulant is formed to encapsulate the sensor chip. The encapsulant covers sidewalls of the covering member and exposes a top surface of the covering member. Top surfaces of the encapsulant and covering member are attached to a temporary carrier. An integrated circuit is mounted on the bottom substrate surface in the die region. The integrated circuit is electrically coupled to contact pads exposed in openings of the bottom substrate surface in a flip-chip manner. The temporary carrier is detached from the encapsulant and covering member after the integrated circuit is mounted on the laminate package substrate.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of various embodiments. In the following description, various embodiments of the present disclosure are described with reference to the following, in which:

FIGS. 3a-3i show cross-sectional views of an embodiment of a process for forming a semiconductor package.

DETAILED DESCRIPTION

Embodiments described herein generally relate to semiconductor packages and methods for forming a semiconductor package. The semiconductor package of the present invention may include multiple semiconductor dies or chips having different functions. In some embodiments, the semiconductor package includes a sensing unit in electrical communication with an integrated circuit (IC). The sensing unit may be a sensor chip used for sensing environmental signals, such as optical signals, audio signals, or the like, while the integrated circuit may be a signal processing unit, such as a microprocessor, digital signal processor (DSP), central processing unit (CPU) or the like. The semiconductor package may be incorporated into electronic devices or equipment, such as sensing devices, navigation devices, telecommunication devices, computers and smart devices. Incorporating the semiconductor package of the present invention into other types of devices or products may also be useful.

Figure 1A:
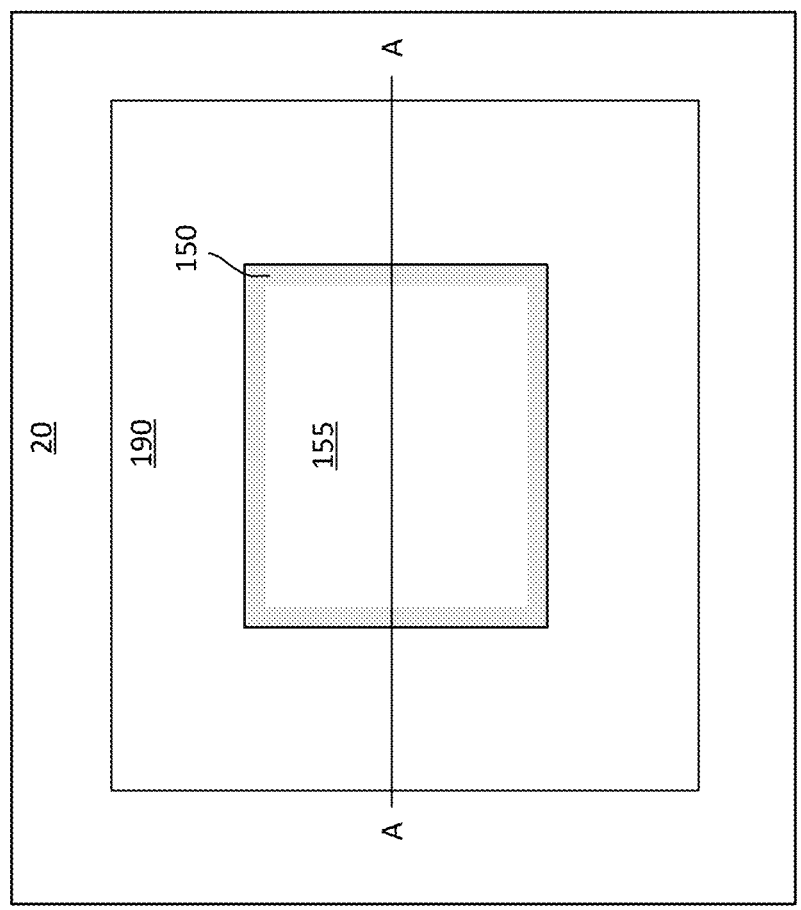
FIG. 1a shows a top view of an embodiment of a semiconductor package.
Figure 1B:
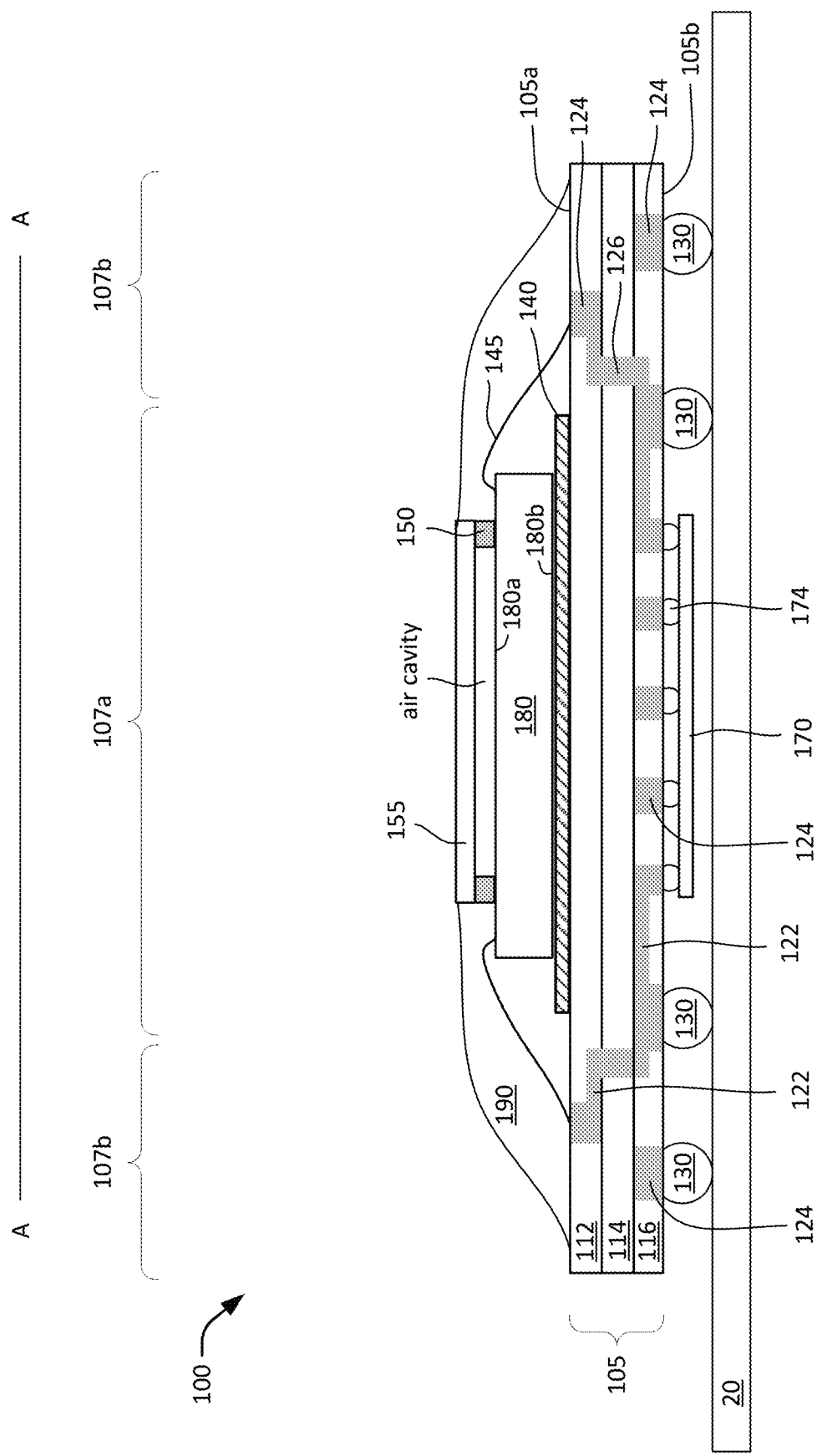
FIG. 1b shows a cross-sectional view of the semiconductor package of FIG. 1a taken along the A-A plane.
Figure 1C:
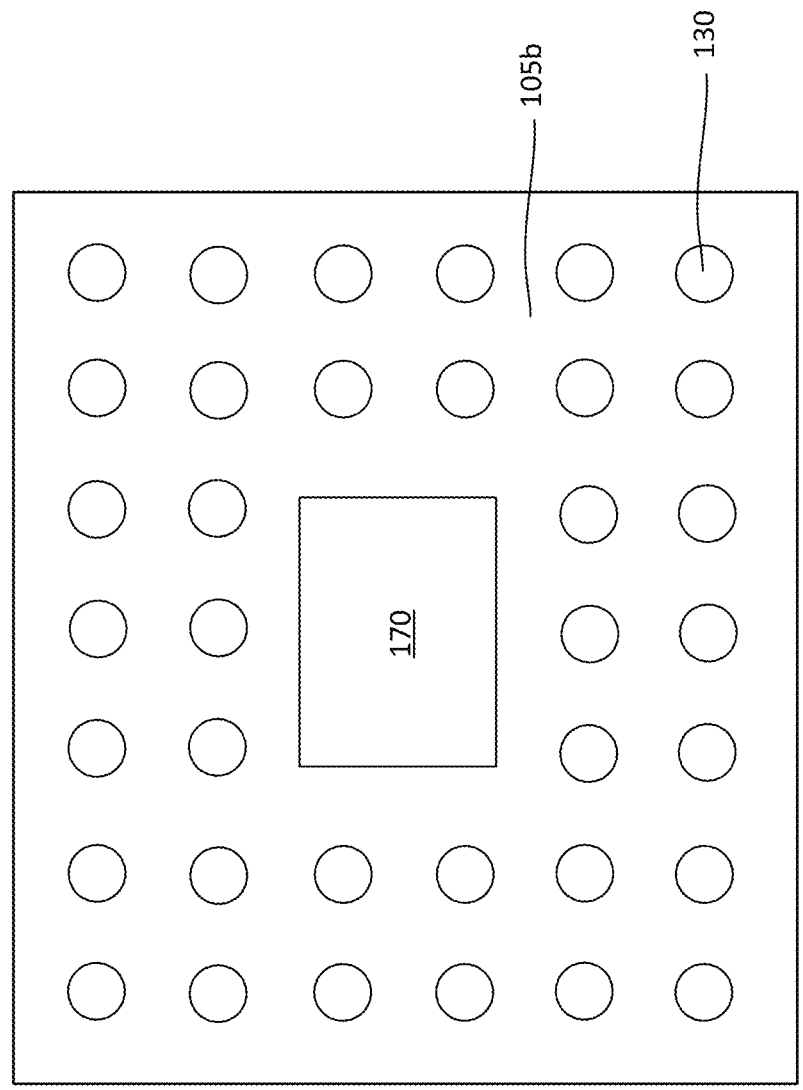
FIG. 1c shows a bottom view of an embodiment of a semiconductor package.

FIGS. 1a-1c show multiple views of a semiconductor package 100 in accordance with one or more embodiments of the present disclosure. Specifically, FIG. 1a shows a top view of the semiconductor package 100 disposed on a printed circuit board (PCB) 20, FIG. 1b shows a cross-sectional view of the semiconductor package 100 and PCB 20 taken along the A-A plane shown in FIG. 1a, and FIG. 1c shows a bottom view of the semiconductor package 100.

The semiconductor package 100 includes a package substrate 105 having a first major surface and a second major surface opposite to the first major surface. The first major surface 105a may be referred to as the top substrate surface and the second major surface 105b may be referred to as the bottom substrate surface. Other designations for the surfaces may also be useful. In one embodiment, the package substrate is a multi-layer substrate. For example, the package substrate includes a stack of electrically insulating substrate layers. The different layers of the package substrate 105 may be laminated or built-up. In one embodiment, the package substrate 105 is a laminate-based substrate. For example, the package substrate 105 includes a core or intermediate layer 114 sandwiched between top and bottom substrate layers 112 and 116. Other types of multi-layer substrate, including ceramic and leadframe substrates, may also be useful. In one embodiment, the top and bottom substrate layers 112 and 116 include a material, which is different to the material of the core layer 114. For example, the top and bottom substrate layers are formed from the same dielectric material. Forming the top and bottom substrate layers with different dielectric material may also be useful. The configuration of the top and bottom substrate layers 112 and 116 may depend on manufacturing considerations. Although three substrate layers are shown in FIG. 1b, it is understood that the package substrate 105 may be configured to include other number of substrate layers, depending on design requirements.

Layers of conductive material are embedded within the package substrate 105 to achieve the desired routing of electrical signals from the first semiconductor chip 180 to the second semiconductor chip 170. The conductive layers form interconnect structures including conductive traces 122, contact pads 124 and via contacts 126. In one embodiment, conductive traces 122 and contact pads 124 are disposed in the top and bottom substrate layers 112 and 116 of the package substrate 105 while via contacts 126 are disposed in the intermediate substrate layer 114. The via contacts 126, for example, electrically connect conductive traces 122 in the top substrate layer to conductive traces 122 in the bottom substrate layer. Generally, contact pads 124 of the package substrate 105 are configured with an increased thickness and pitch relative to the traces 122 to facilitate coupling one or more semiconductor die or chip to the interconnect structures of the package substrate 105. For example, the contact pads 124 serve as terminal pads (or bonding pads) of the package substrate 105. Conductive traces 122, for example, electrically couple contact pads 124 to via contacts 126. Other configurations of contact pads 124 and conductive traces 122 may also be useful. It is understood that the contact pads 124 may also serve as external connections to electrically connect one or more semiconductor die or chip in the semiconductor package 100 to an external circuit, such as a printed circuit board (PCB) 20, as shown particularly in FIG. 1b. Electrically connecting the semiconductor package 100 to other types external circuit, such as an interposer substrate, may also be useful.

The conductive layers of the package substrate 105 correspond to interconnect levels defined by via levels and line levels. For example, via contacts 126 are disposed on a via level while conductive traces 122 and contact pads 124 are disposed on a line level. In one embodiment, the package substrate 105 includes 2 line levels interconnected by a via level between the line levels to achieve the appropriate routing interconnection. Alternatively, the package substrate 105 may include other number of interconnect levels depending on the number of substrate layers. For example, the package substrate may include n number of line levels and m number of via levels, where n is any number within the design requirement for the package substrate 105 and m is a value equal to (n−1). For example, n may include a minimum value of 2.

The semiconductor package 100 is defined with a die region 107a and a non-die region 107b surrounding the die region 107a. In one embodiment, the die region 107a of the semiconductor package 100 includes a first semiconductor chip 180 disposed on the top substrate surface 105a, and a second semiconductor chip 170 disposed on the bottom substrate surface 105b. The first and second semiconductor chips 180 and 170 are, for example, centrally disposed in the die region 107a of the package substrate 105. Other configurations and locations of die and non-die regions may also be useful.

The first semiconductor chip 180 may be a sensor chip having first and second major surfaces 180a and 180b. The first major surface 180a may be an active surface and the second major surface 180b may be an inactive surface. For example, the active surface 180a of the sensor chip includes openings to expose a sensing element and a plurality of contact pads. In one embodiment, the sensor chip 180 includes a photosensitive sensing element configured to convert optical signals received from the environment into electrical signals for further processing. For example, the sensor chip 180 transmits electrical signals to the second semiconductor chip 170 for signal processing. The sensor chip 180 may be an image-sensing semiconductor chip (hereinafter "image sensor"). Although an image sensor is described herein, it should be appreciated that other types of sensor chip may also be used without departing from the spirit of the present invention.

The active surface 180a of the image sensor 180 may include a centrally positioned main region, and a frame region surrounding the main region. The frame region, for example, extends along the periphery of the active surface 180a. In one embodiment, the image sensor 180 includes die pads (not shown) disposed along the periphery of the frame region while the sensing element of the image sensor 180 is disposed centrally within the main region of the active surface 180a. For example, the active surface of the image sensor may include openings in a final (or topmost) passivation layer to expose the die pads and sensing element. Providing die pads at other locations of the image sensor 180 may also be useful. The die pads provide electrical connection to the internal circuitry of the image sensor 180.

In one embodiment, the die pads of the sensor chip 180 are electrically connected to interconnect structures in the package substrate 105 by wire bond connections. For example, conductive wires 145 connect die pads of the image sensor 180 to contact pads 124 disposed in the top substrate layer 112. The conductive wires 145 may include any suitable metal material including aluminum (Au), copper (Cu), silver (Ag), gold (Au) or any alloy thereof. It is understood that an insulative outer coating may also be formed on the conductive wires 145 to protect the wires.

In one embodiment, a die attach layer 140 is disposed on the top substrate surface 105a in the die region 107a. The die attach layer 140 is, for example, an adhesive layer. Various adhesive material may be used to form the die attach layer 140, including epoxy resin paste, polyimide tape, or the like. The die attach layer 140 attaches the image sensor 180 to the package substrate 105. For example, the inactive surface 180b of the image sensor is directly mounted onto the die attach layer 140.

In one embodiment, the semiconductor package 100 includes a transparent covering member 155 disposed over the sensing element of the image sensor 180. The covering member 155, for example, completely overlaps the main region of the active surface 180a and extends partially into the frame region of the active surface 180a. The covering member 155 includes high transparency and a desired refractive index to allow optical signals to travel through and reach the image sensor 180 efficiently. The covering member 155 may be formed from various transparent material including glass and plastic material.

The semiconductor package 100 includes a covering member 155 mounted on the image sensor 180. In one embodiment, the covering member 155 is attached to the image sensor 180 using an adhesive material 150. For example, the adhesive material 150 bonds the bottom surface of the covering member 155 to the active surface 180a of the image sensor 180. In one embodiment, the adhesive material 150 extends continuously along the periphery of the bottom surface of the covering member 155, as shown particularly in FIGS. 1a and 1b. For example, the adhesive material 150 is disposed in the frame region of the active surface 180a without extending into the main region of the active surface 180a. The adhesive material 150 seals the space between the covering member 155 and the sensing element in the image sensor 180 to define an air cavity within the semiconductor package 100. The adhesive material 150 may be different from the material of the die attach layer 140. Preferably, the adhesive material 150 forms a raised structure or spacer (hereinafter "standoff structure") between the image sensor 180 and the covering member 155. The adhesive material is, for example, a UV-curable and non-conductive adhesive. Various UV-curable non-conductive polymer may be used to form the standoff structure 150, including epoxy, acrylate, urethane, thiol, or a combination thereof. Other adhesive materials may also be useful.

An encapsulant 190 is disposed on the package substrate 105. The encapsulant 190 surrounds the image sensor 180 and covers the conductive wire 145. The encapsulant 190 is configured to expose the top surface of the covering member 155 while protecting the image sensor 180, as shown particularly in FIG. 1a. In one embodiment, the encapsulant 190 substantially covers the sidewalls of the covering member 155 without extending over the covering member 155. For example, the topmost surface of the encapsulant 190 may be about level with the top surface of the covering member 155. Alternatively, the topmost surface of the encapsulant 190 may be formed slightly below the top surface of the covering member 155.

The encapsulant 190 extends into the non-die region 107b of the semiconductor package 100 to cover the exposed top surface of the contact pads 124 in the top substrate layer 112. In one embodiment, the top surface of the encapsulant slopes downwardly from the covering member 155 toward a perimeter of the non-die region 107b. The encapsulant 190 is, for example, formed with sufficient encapsulant material to cover the image sensor 180, wires 145 and contact pads 124. Although a bell-shaped encapsulant 190 is shown, it is understood that the encapsulant 190 may also be formed with vertical sidewalls and a substantially planar top surface. The encapsulant may include any suitable molding compound such as ceramic, plastic, epoxy, or a combination thereof, to provide a rigid and mechanically strong structure to protect the image sensor 180 from the environment. For example, the encapsulant protects the image sensor 180 from moisture and provides the covering member 155 with mechanical support.

A second semiconductor chip 170 (or integrated circuit) may be mounted on the bottom substrate surface 105b in the die region 107a. In one embodiment, the second semiconductor chip 170 is a signal processing unit (hereinafter "signal processor") electrically connected to the image sensor 180 by way of the interconnect structures. The signal processor 170, for example, functions as a microprocessor. The signal processor 170 processes electrical signals generated from the image sensor to perform a desired function. Providing other types of signal processor including digital signal processor, a central processor unit (CPU), or the like may also be useful, depending on the desired function. The signal processor 170 includes first and second major surfaces. The first major surface may be an inactive surface and the second major surface may be an active surface. For example, die pads (not shown) are exposed in openings of the active surface of the signal processor 170 to provide electrical connection to the internal circuitry of the signal processor 170. In one embodiment, the signal processor 170 includes metal bumps 174 disposed on the die pads to electrically couple the signal processor 170 to contact pads 124 exposed in openings of the bottom substrate surface 105b in a flip-chip manner. For example, the signal processor 170 is a flip-chip assembly. The contact pads 124 in the bottom substrate layer 116, which are positioned in the die region 107a, are configured to match the pattern of the die pads of the signal processor 170. The metal bumps 174 may be spherical shaped structures formed from solder material.

In one embodiment, the contact pads 124 in the bottom substrate layer 116, which are positioned in the non-die region 107b, serve as signal input/output (I/O) terminals of the package substrate 105. For example, package contacts 130 are disposed on the contact pads 124 exposed in openings of the bottom substrate surface 105b in the non-die region 107b to electrically couple the interconnect structures in the package substrate 105 to an external device, such as a printed circuit board (PCB) 20. Various conductive materials may be used to form the package contacts 130. In one embodiment, the package contacts are, spherical shaped metal bumps. Other shapes or configurations of protruding package contacts may also be useful. Various types of metal material can be used to form the package contacts 130. The package contacts 130, for example, can be formed from solder materials. For example, the solder material can be a lead-based or non lead-based solder. Other suitable types of conductive materials may also be used.

The package contacts 130 protrude from the bottom substrate surface 105b. In one embodiment, the package contacts 130 extend downwardly beyond the signal processor 170. The package contacts 130, for example, extend a distance defined by a thickness of the package contacts 130. In one embodiment, the package contacts 130 include a thickness substantially thicker than a combined thickness of the signal processor 170 and its corresponding metal bumps 174. For example, when the package contacts 130 are disposed on an external device, such as the PCB 20, the thickness of the package contacts 130 is sufficient to provide a desired clearance between the inactive surface of the signal processor 170 and the PCB. The thickness of the package contacts 130 may depend on design requirements. The package contacts 130 may be arranged to form a ball grid array (BGA), as shown particularly in FIG. 1c. Other arrangement of package contacts 130 may also be useful.

In comparison with conventional semiconductor packages, the present invention integrates a sensor chip 180 and a flip chip assembly (e.g., processor unit 170) into a common semiconductor package 100. In applications where multiple sensors are required, the semiconductor package 100 of the present invention enables parallel processing of the signals received by the sensor chip 180, which improves signal processing efficiency and allows faster actuation of the desired function. The present invention also requires a smaller PCB footprint relative to separately packaged processor units.

Figure 2A:
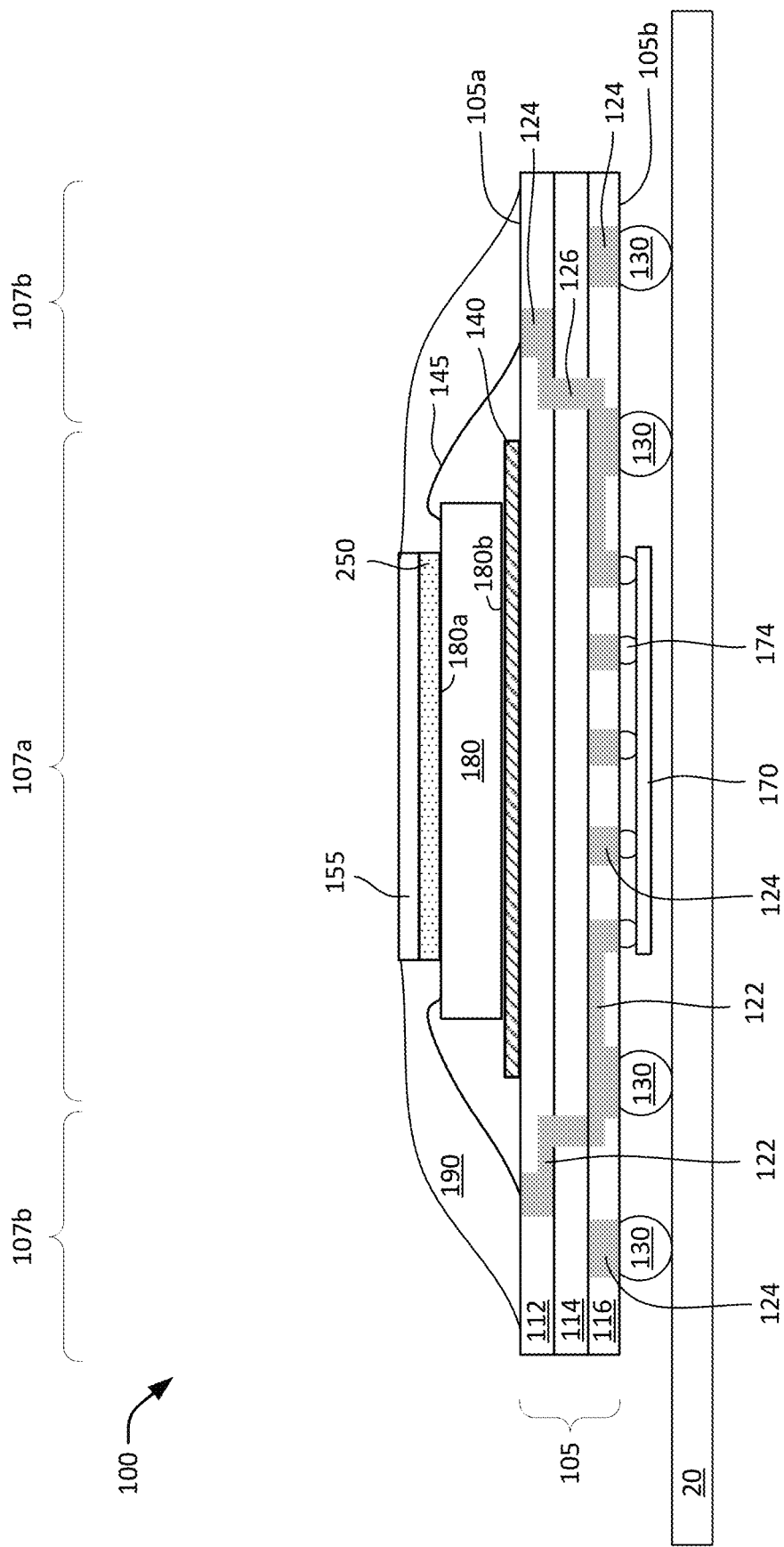
FIG. 2a shows a cross-sectional view of another embodiment of a semiconductor package.
Figure 2B:
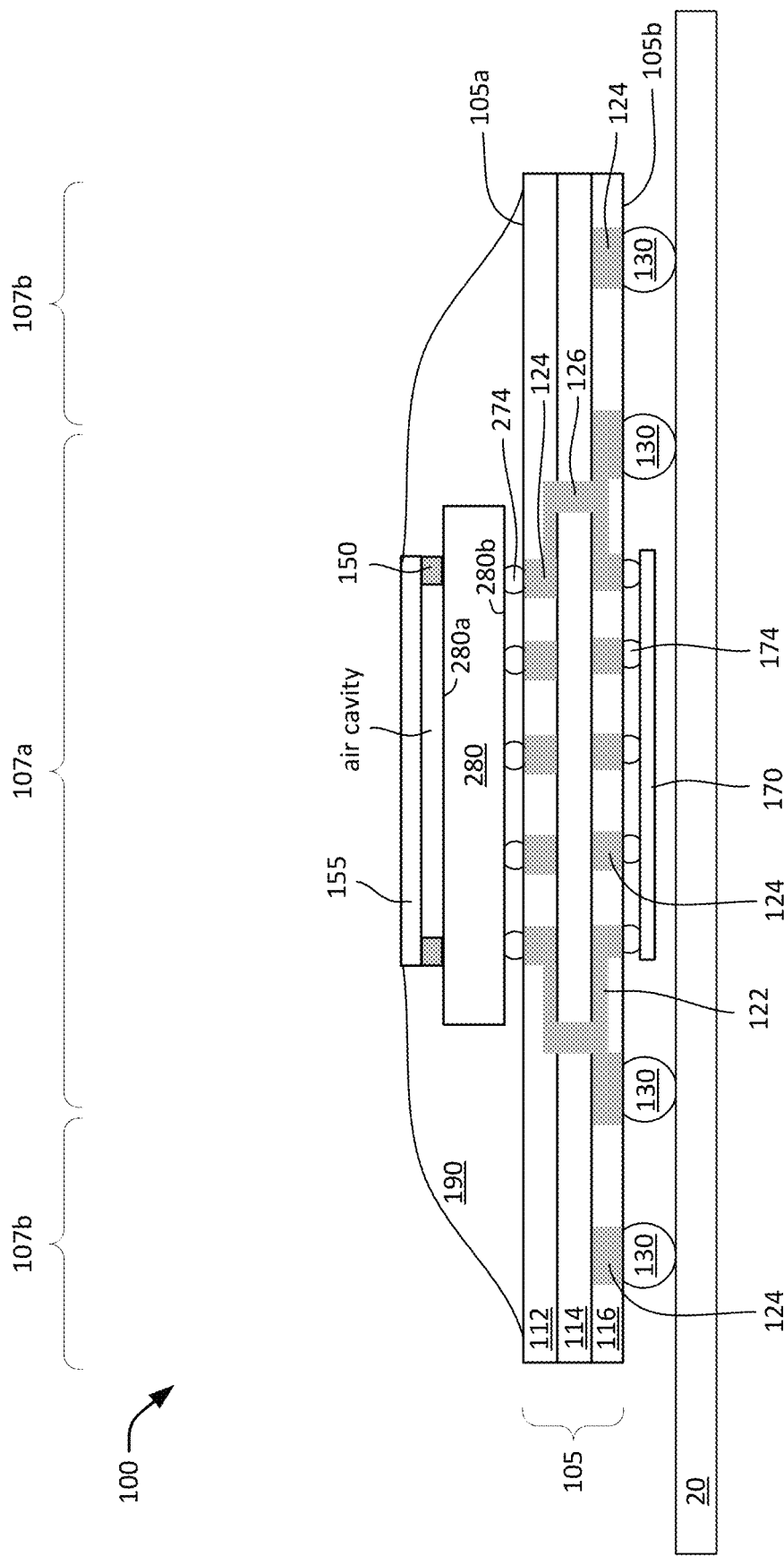
FIG. 2b shows a cross-sectional view of yet another embodiment of a semiconductor package.
Figure 2C:
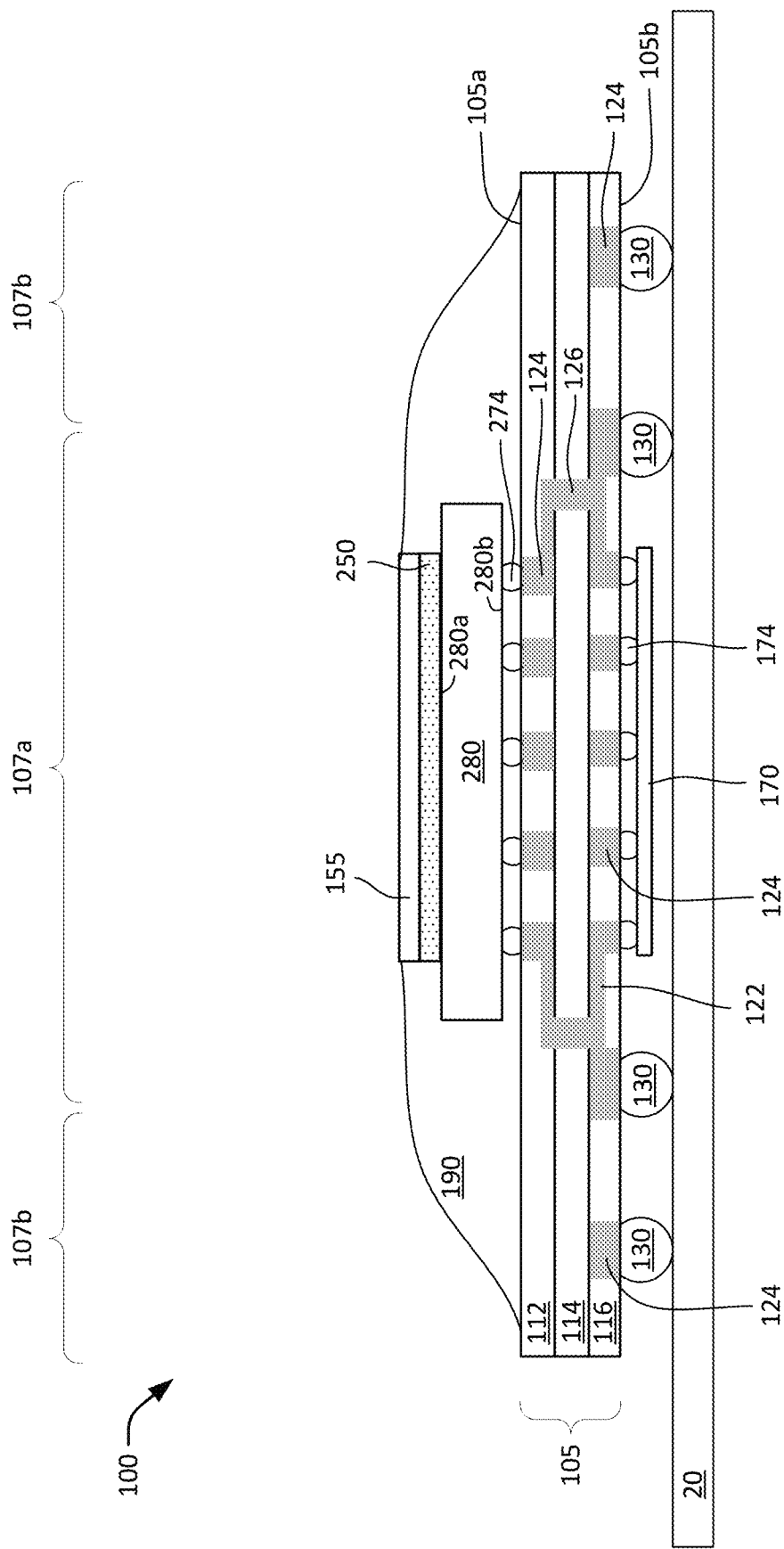
FIG. 2c shows a cross-sectional view of another embodiment of a semiconductor package.

FIGS. 2a-2c show cross-sectional views of other embodiments of a semiconductor package 100 in accordance with the present disclosure. For example, FIG. 2a shows a cross-sectional view of another embodiment of the semiconductor package 100; FIG. 2b shows a cross-sectional view of yet another embodiment of the semiconductor package 100; and FIG. 2c shows a cross-sectional view of another embodiment of the semiconductor package 100. The semiconductor package 100 is similar to that described in FIGS. 1a-1c. For example, the semiconductor package includes a first and a second semiconductor chip mounted on a common package substrate 105. Common elements and features having the same reference numerals may not be described or described in detail. In the interest of brevity, the description below primarily focuses on the difference(s) of the semiconductor package 100 shown in FIGS. 2a-2c as compared with the semiconductor package shown in FIG. 1b.

Referring to FIG. 2a, the semiconductor package 100 includes a covering member 155 mounted on the image sensor 180. In one embodiment, the covering member 155 is attached to the image sensor 180 using an adhesive layer 250. For example, the adhesive layer 250 bonds the bottom surface of the covering member 155 to the active surface 180a of the image sensor 180. In one embodiment, the adhesive layer 250 covers the entire bottom surface of the covering member 155, as shown particularly in FIG. 2a. For example, the adhesive layer 250 traverses the main region of the active surface 180a of the image sensor 180. In this case, the adhesive layer 250 is an optically transparent adhesive material having a same, or substantially similar, refractive index to that of the covering member 155. In one embodiment, the adhesive layer 250 may be a UV-curable non-conductive adhesive material having high transparency and high refractive index greater than 1.5. For example, the refractive index of the adhesive layer 250 may be 1.7 or more. Various UV-curable non-conductive polymer having high transparency and high refractive index may be used to form the adhesive layer 250, including epoxy, acrylic, polyimide, urethane, thiol, or a combination thereof. Other suitable adhesive materials may also be useful, depending on the desired refractive index of the covering member 155.

Providing an adhesive layer 250 having a refractive index that matches the desired refractive index of the covering member 150 prevents or minimizes loss of optical resolution when optical signals travel through the different medium to reach the image sensor 180. For example, reflection coefficient of light is advantageously reduced at the surface interface of two media with matching refractive indices, as compared to a surface interface of two media with different refractive indices. Accordingly, high fidelity images may be captured by the image sensor 180.

Referring to FIG. 2b, the die region 107a of the semiconductor package 100 includes a first semiconductor chip 280 disposed on the top substrate surface 105a, and a second semiconductor chip 170 disposed on the bottom substrate surface 105b. The first and second semiconductor chips 280 and 170 are, for example, centrally disposed in the die region 107a of the package substrate 105. Other configurations and locations of die and non-die regions may also be useful. The first semiconductor chip 280 may be a sensor chip having first and second major surfaces 280a and 280b. For example, the first semiconductor chip 280 is an image sensor similar to the image sensor 180 described in FIGS. 1a-1c.

In one embodiment, the first and second major surfaces 280a and 280b of the image sensor 280 are active surfaces. For example, the first active surface 280a of the image sensor 280 includes an opening to expose a photosensitive sensing element, while the second active surface 280b of the image sensor 280 includes openings to expose a plurality of die pads (not shown), which provide electrical connection to the internal circuitry of the image sensor 280. In one embodiment, the image sensor 280 includes metal bumps 274 disposed on the die pads to electrically couple the image sensor 280 to contact pads 124 exposed in openings of the top substrate surface 105a in a flip-chip manner. For example, the image sensor 280 is a flip-chip assembly. In this case, the contact pads 124 in the top substrate layer 112 are positioned in the die region 107a and configured to match the pattern of the die pads of the image sensor 280. The metal bumps 274 may be spherical shaped structures formed from solder material.

Providing a flip-chip-type image sensor 280 results in various advantages relative to wire bond technology, including superior thermal and electrical performance and higher input/output (I/O) capability. In addition, although the image sensor 280 is illustrated as having the standoff structure 150 disposed on the first active surface 280a, it is appreciated that the transparent adhesive layer 250 may also be formed on the first active surface 280a, as shown particularly in FIG. 2c. For example, a transparent adhesive layer 250 having a refractive index that matches the desired refractive index of the covering member 150 may be used to mount the covering member on the image sensor 280.

FIGS. 3a-3i show cross-sectional views of an embodiment of a process 300 for forming a semiconductor package. The semiconductor package is, for example, same or similar to that described in FIGS. 1a-1c and 2a-2c. For example, the process 300 forms a semiconductor package having a first and a second semiconductor chip mounted on a common package substrate. In the interest of brevity, common elements and features having the same reference numerals may not be described or described in detail.

Figure 3A:
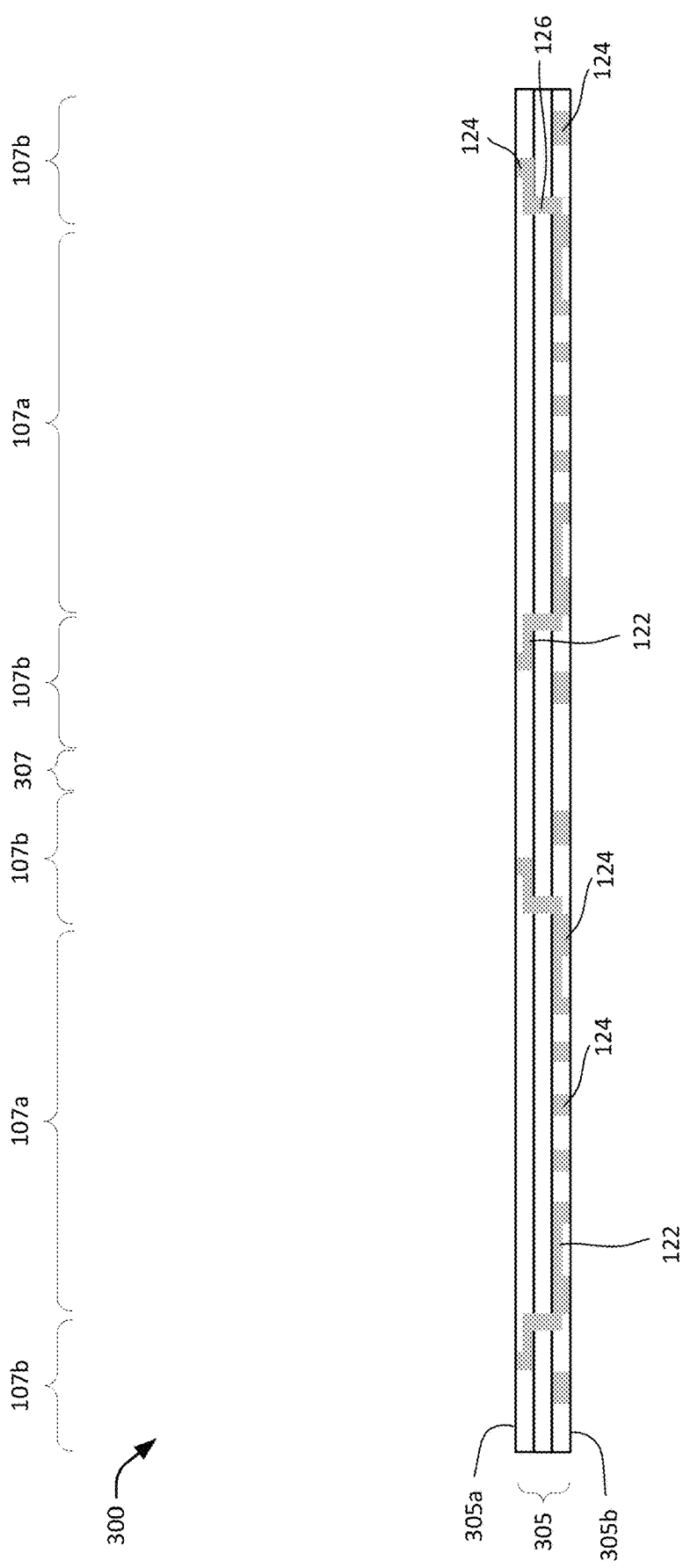

Referring to FIG. 3a, a multi-layer package substrate 305 is provided. In one embodiment, the multi-layer package substrate 305 is fabricated as a laminate substrate using appropriate semiconductor processes. For example, the package substrate 305 includes a core substrate layer 114 disposed between top and bottom substrate layers 112 and 116. Other techniques may also be employed to form a multi-layer substrate. For example, the different layers of the substrate may also be built-up.

Various dielectric materials can be used to form the core substrate layer 114 of the package substrate 305. For example, the core substrate layer 114 may include a glass-reinforced epoxy material, such as FR-4 (flame retardant, class 4) epoxy, Bismaleimide-Triazine (BT) resin, or the like. In one embodiment, openings are formed in the core substrate layer 114 using mask and etch techniques to form a conductive layer in the core substrate layer 114. For example, a patterned resist mask with openings is provided over the core substrate layer 114. The openings of the patterned resist mask are positioned to correspond with locations where conductive structures are to be formed in the core substrate layer 114. An anisotropic etch, such as RIE, is performed to pattern the core substrate layer 114 using the patterned resist mask. The etch process forms openings which extend vertically through the core substrate layer (e.g., from the top planar surface to the bottom planar surface). A conductive material, such as tungsten, copper, aluminum, or any alloy thereof, is deposited on the core substrate layer to fill the openings. The conductive material may be deposited by sputtering. Other techniques may also be useful. A planarization process, such as chemical mechanical planarization (CMP), is performed to remove excess conductive material and define the conductive layer in the core substrate layer 114. The core substrate layer 114 may be an intermediate substrate layer and the conductive layer may be an intermediate interconnect level such as that described with respect to FIG. 1b. For example, via contacts 126 are formed in the core substrate layer 114 to define a via level.

The process continues to form additional conductive and non-conductive layers of the package substrate 305. In one embodiment, a first metal layer is laminated on the top surface of the core substrate layer 114 and a second metal layer is laminated on the bottom surface of the core substrate layer 114. The first and second metal layers may be patterned to form conductive structures of a first and second interconnect level using, for example, mask and etch techniques. For example, the first and second metal layers are patterned to form conductive traces 122 and contact pads 124 of a first and second line level. Other techniques for forming conductive traces 122 and contact pads 124 may also be useful. It is understood that the conductive layers of the package substrate 305 may be formed from the same conductive material, such as copper or aluminum to optimize electrical conductivity. For example, the via contacts, contact pads and conductive traces of the package substrate 305 may be formed from copper or copper alloy. Alternatively, forming different conductive layers with different conductive materials may also be useful. The conductive layers of the package substrate 305 are interconnected to achieve the desired routing interconnection.

In one embodiment, a dielectric material is disposed on the top and bottom surfaces of the core substrate layer 114 to form top and bottom substrate layers 112 and 116. For example, the top and bottom substrate layers 112 and 116 are formed from a same dielectric material. The dielectric material, for example, includes epoxy resin which is not internally reinforced, such as but not limited to solder mask material. Other dielectric materials may also be used to form the top and bottom substrate layers 112 and 116. The top and bottom substrate layers may be formed by various methods including printing and curing liquid epoxy resin or photosensitive resin, or laminating epoxy resin dry film, on the surfaces of the core substrate layer 114. Other techniques and materials may also be used to form the laminate substrate 305.

In one embodiment, the top and bottom substrate layers cover and protect the conductive traces 122 from moisture and contaminations. The top and bottom substrate layers 112 and 116 may be formed with a sufficient thickness to cover the conductive traces 122 of the metal layers and expose only the top surface of the contact pads 124 to provide a contact area for bonding metal bumps and/or bonding wires. Providing a top and a bottom substrate layer 112 and 116 made of a same dielectric material provides the top and bottom substrate layers with the same CTE (coefficient of thermal expansion), thereby mitigating any risk of substrate warpage and deformation during the substrate fabrication process. It is to be appreciated that different dielectric materials may also be used to form the top and bottom substrate layers.

In one embodiment, the package substrate 305 is a wafer level substrate. The package substrate 305 is, for example, defined with a plurality of active regions, spaced apart from each other by inactive regions 307, to accommodate a corresponding number of semiconductor packages, such as that described with respect to FIGS. 1a-1c and 2a-2c. The inactive regions 307 include dicing or scribe channels defined on the top substrate surface 305a and/or bottom substrate surface 305b. In one embodiment, an active region of the wafer level substrate includes a die region 107a and non-die region 107b surrounding the die region 107a. For example, the package substrate 305 includes multiple die and non-die regions 107a and 107b.

Referring to FIG. 3b, a first type semiconductor die or chip 180 is disposed in each active region of the package substrate 305. The first type semiconductor chip 180 is, for example, mounted on the top substrate surface 305a in the die region 107a. The first type semiconductor chip 180 may be an image sensor. In one embodiment, a die attach layer 140 is used to attach the image sensor to the package substrate 305. The die attach layer 140 is, for example, an adhesive in the form of paste, film or tape. Other suitable methods may also be used to attach the image sensor 180 to the package substrate 305. Various adhesive materials, such as epoxy resin and polyimide may be used to form the die attach layer 140. In one embodiment, the die attach layer 140 is formed by printing an adhesive paste onto the top substrate layer 112 and pre-curing the adhesive paste. The image sensor 180 is disposed on the pre-cured adhesive paste and a post-curing process is subsequently performed to complete the die attachment. In one embodiment, the die attach layer 140 is formed from a material having a CTE which complements the CTE of the top substrate layer 112 to avoid substrate warpage and deformation. In an alternative embodiment, the die attach layer 140 includes thermally conductive adhesive material which dissipates heat generated by the image sensor 180 during operation. The die attach layer 140 may include, for example, silver paste, solder paste, non-conductive paste, or epoxy resin with ceramic filler.

The process continues by electrically coupling the die pads (not shown) of the image sensor 180 to the contact pads 124 of the package substrate 305 using conductive wires 145. For example, a first end of the wire 145 is bonded to the die pads of the image sensor 180 while a second end of the wire 145 is bonded to the exposed top surface of the contact pads 124 in the top substrate layer 112. The wires 145 may be formed and applied to the die pads and contact pads 124 using wire bonding technique. Other suitable techniques may also be used. Various conductive materials, including aluminum (Au), copper (Cu), silver (Ag), gold (Au) or any alloy thereof, may be used to form the conductive wires 145 and wire bonds.

In an alternative embodiment, the first type semiconductor chip may be a flip chip assembly, such as that described with respect to FIGS. 2b-2c. For example, a flip-chip-type image sensor 280 may be mounted on the top substrate surface 305a in the die region 107a. In such case, the process 300 does not form the die attach layer 140 and the conductive wires 145. Rather, terminal contacts 274 formed from solder material would couple die pads, exposed along a second active surface 280b of the image sensor 280, to the contact pads 124 in a flip-chip manner. For example, the contact pads 124 in the top substrate layer 112 would be positioned in the die region 107a and configured to match the pattern of the die pads of the image sensor 280. Other methods for attaching a flip-chip assembly to the interconnect structures of the package substrate 305 may also be useful.

Figure 3C:
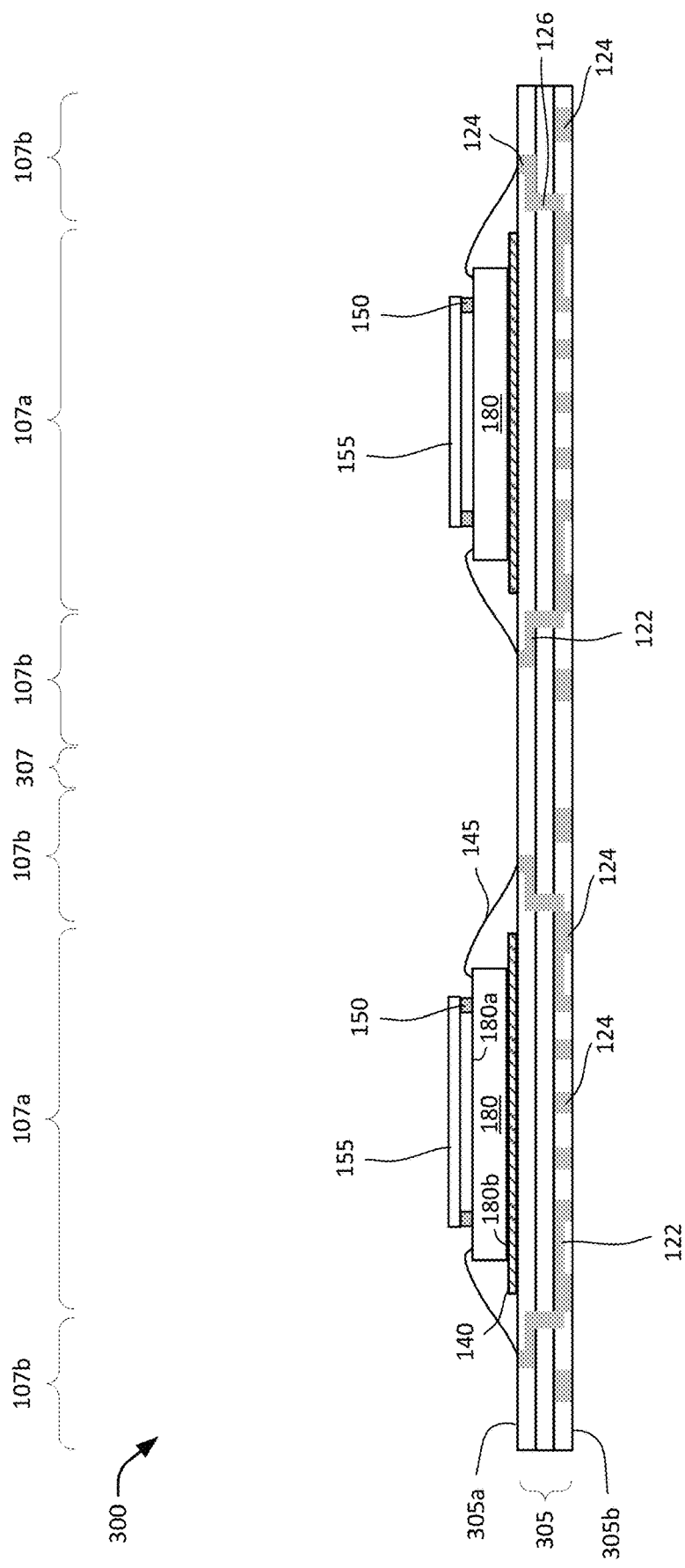

Referring to FIG. 3c, a covering member 155 is attached to the active surface 180a of the image sensor 180 using an adhesive material. The covering member 155 may be formed from any material having good transparency and a desired refractive index. The covering member 155 is, for example, glass or plastic. In one embodiment, the material of the covering member 155 is glass. The adhesive material 150 bonding the covering member 155 is, for example, a UV curable and non-conductive adhesive. Other adhesive material may also be useful. The adhesive material 150 forms a standoff structure and seals the space between the covering member 155 and the sensing element of the image sensor 180, thereby forming an air cavity. Various UV-curable non-conductive polymer may be used to form the standoff structure 150, including epoxy, acrylate, urethane, and thiol. Other adhesive materials may also be useful.

In an alternative embodiment, the process 300 may form an adhesive layer 250, such as that described with respect to FIGS. 2a and 2c, to mount the covering member 155 to the image sensor 180. For example, the adhesive layer 250 is a UV curable and non-conductive transparent adhesive material having a same, or substantially similar, refractive index to that of the covering member 155. In such case, the adhesive layer 250 covers the entire bottom surface of the covering member 155, and traverses the main region of the active surface 180a of the image sensor 180, as shown particularly in FIG. 2a.

Figure 3D:
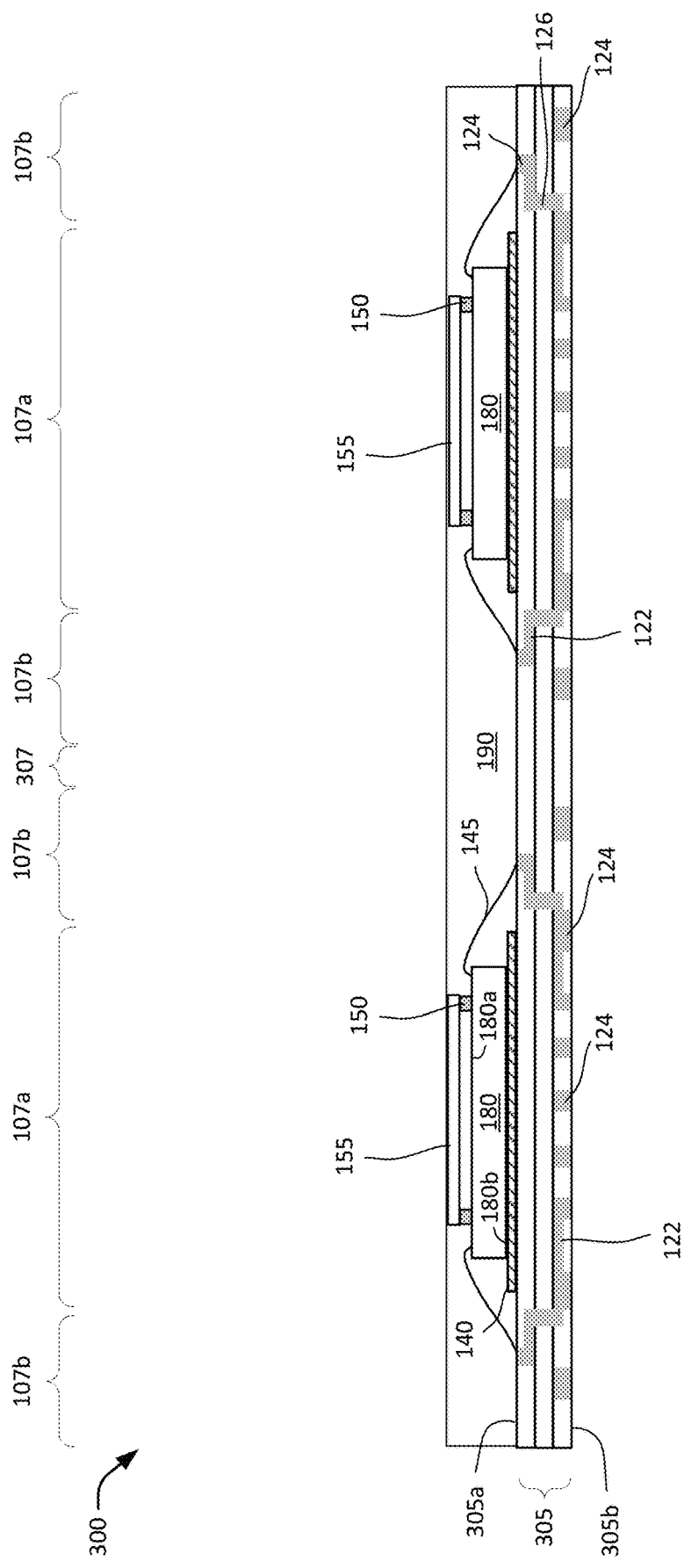

Referring to FIG. 3d, an encapsulant 190 is formed over the image sensor and the conductive wires 145. The encapsulant, for example, comprises a molding compound. The encapsulant 190 may be formed by a liquid encapsulation process such as transfer, compression or injection molding. Other techniques or materials may also be useful to form the encapsulant 190. As shown, the encapsulant 190 is formed with a substantially planar top surface to facilitate bonding to a support carrier, as will be described later. In one embodiment, the encapsulant 190 substantially covers the sides of the covering member 155 without extending over the covering member 155. For example, the planar top surface of the encapsulant 190 may be about level with the top surface of the covering member 155. Alternatively, the top surface of the encapsulant 190 may be slightly below the top surface of the covering member 155.

Figure 3E:
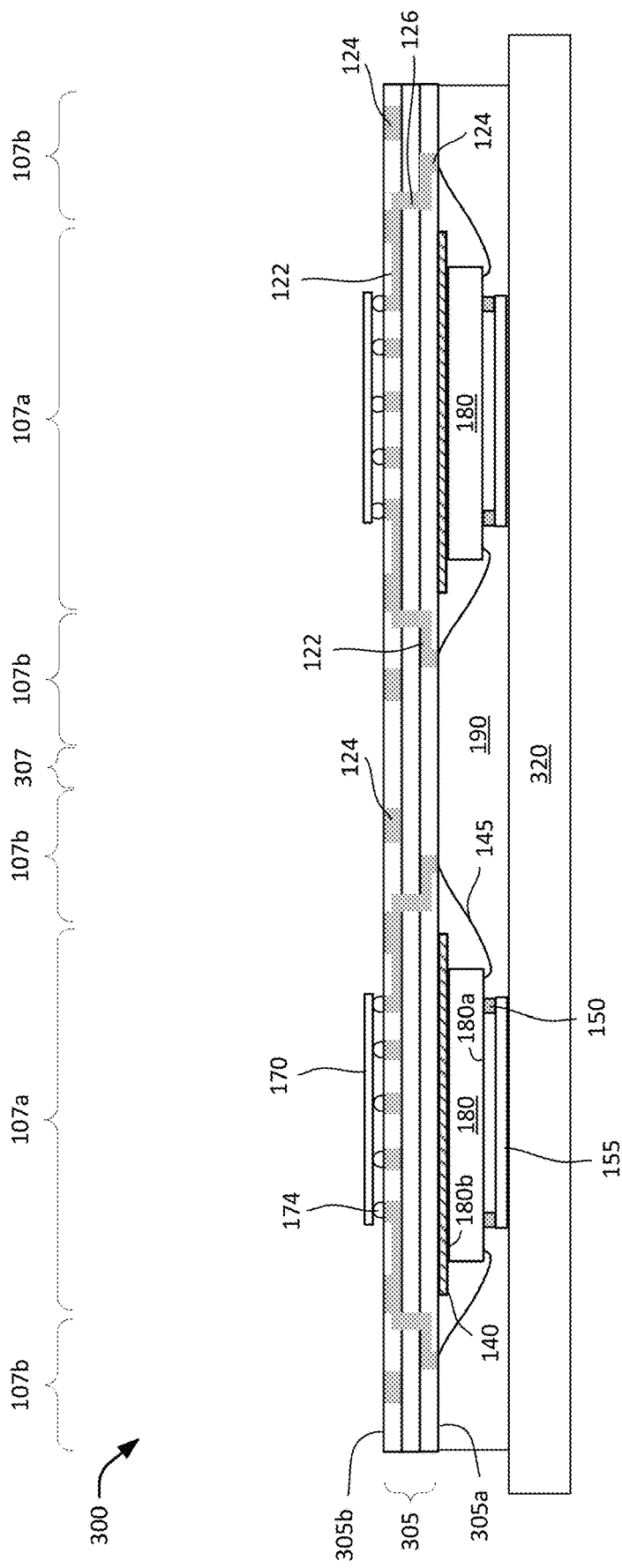

Referring to FIG. 3e, a support carrier 320 having top and bottom surfaces is provided. The support carrier, for example, provides a temporary support for processing the package substrate 305. The carrier 320 should be sufficiently rigid to withstand further processing steps, including a subsequent process to attach a second type semiconductor chip 170, as will be described in detail. The carrier 320 provides sufficient support to stabilize the package substrate 305 when the second type semiconductor chip 170 is attached to the bottom substrate surface 305b of the package substrate 305. Various types of materials may be used to form the support carrier 320. By way of non-limiting example, the support carrier 320 may be a silicon wafer, conductive tape, metallic plate or the like.

In one embodiment, an adhesive agent (not shown) is provided on the top surface of the support carrier 320 to facilitate temporary bonding of the covering member 155 and encapsulant 190 to the support carrier 320. The adhesive agent, for example, can be any suitable type of adhesive that allows easy separation of the covering member 155 and encapsulant 190 from the support carrier 320 without affecting the pre-determined transparency and refractive index of the covering member 155. Other temporary bonding techniques may also be useful. The adhesive agent may be in different forms including tape, liquid or paste. The adhesive agent may be provided on the top surface of the support carrier using various techniques depending on the type or form of the adhesive agent. For example, a tape adhesive may be provided on the support carrier 320 by lamination, a paste adhesive may be provided on the support carrier by printing while a liquid adhesive may be provided on the substrate by spin coating.

In an alternative embodiment, the support carrier 320 may be defined with recesses or pockets to stabilize the package substrate 305. For example, the support carrier 320 may include one or more recessed regions having sufficient depth and width dimension to accommodate the encapsulant 190, and keep the package substrate 305 in position during processing. In such case, an adhesive agent may not be provided on the support carrier 320.

The process continues by attaching a second type semiconductor chip 170 on the bottom substrate surface 305b. The second type semiconductor chip 170 is for example, positioned centrally in the die region 107a. The second type semiconductor chip 170 may be a signal processor which is electrically connected to the image sensor 180 by way of the interconnect structures in the package substrate 305. In one embodiment, the signal processor 170 is coupled to the exposed surface of contact pads 124 in the bottom substrate layer 116. For example, terminal contacts 174 formed from solder material couples die pads of the signal processor 170 to the contact pads 124 in a flip-chip manner. Other methods for attaching the signal processor 170 to the interconnect structures of the package substrate 305 may also be useful.

Figure 3F:
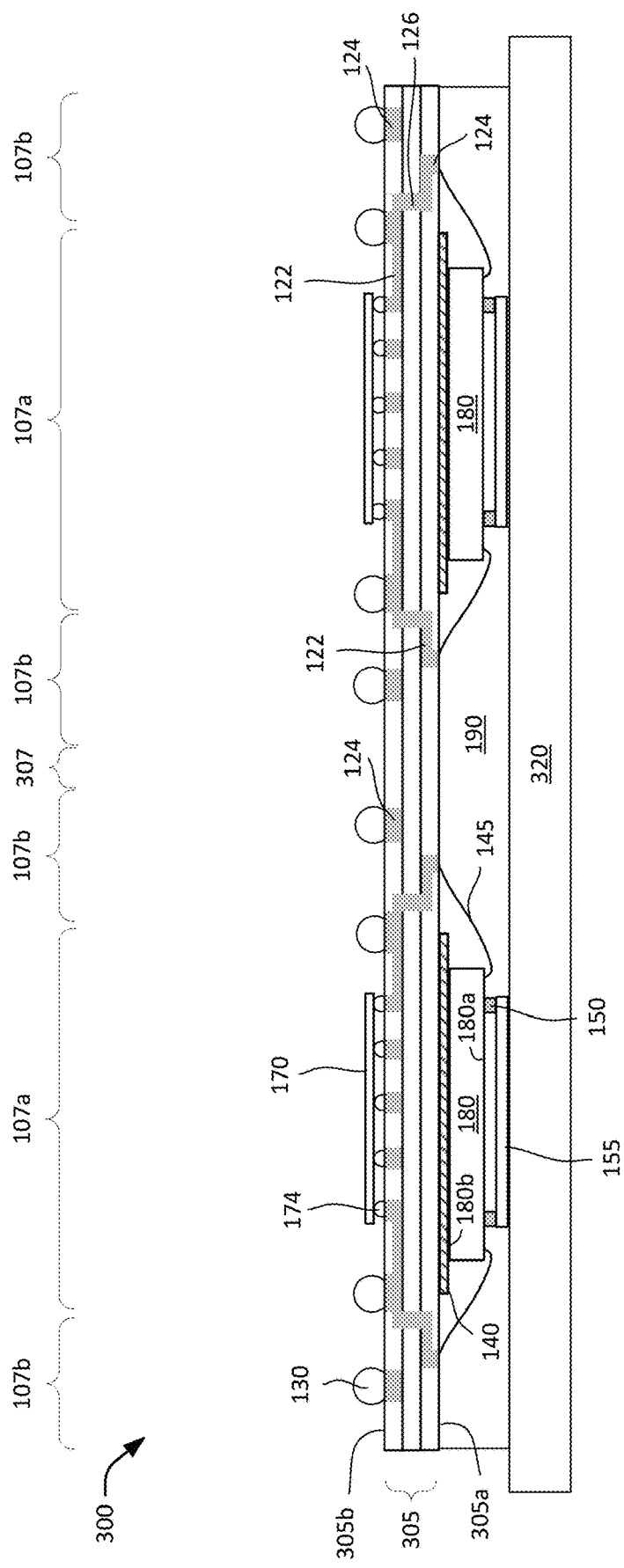

Referring to FIG. 3f, package contacts 130 are formed on the bottom substrate surface 305b in the non-die region 107b. In one embodiment, the package contacts 130 are formed to protrude outwardly from the bottom substrate surface 305b. The package contacts 130, for example, protrudes sufficiently beyond the signal processor 170 to provide the signal processor 170 with a desired clearance from an external circuit, such as a printed circuit board (PCB) 20, as shown particularly in FIG. 1b. The package contacts 170 extend a distance defined by a thickness of the package contacts 130. The package contacts 130, for example, may comprise spherical shaped structures or balls arranged in grid pattern to form a BGA type semiconductor package. The package contacts may be formed from solder material. Other suitable conductive materials may also be used to form the package contacts 130.

Figure 3G:
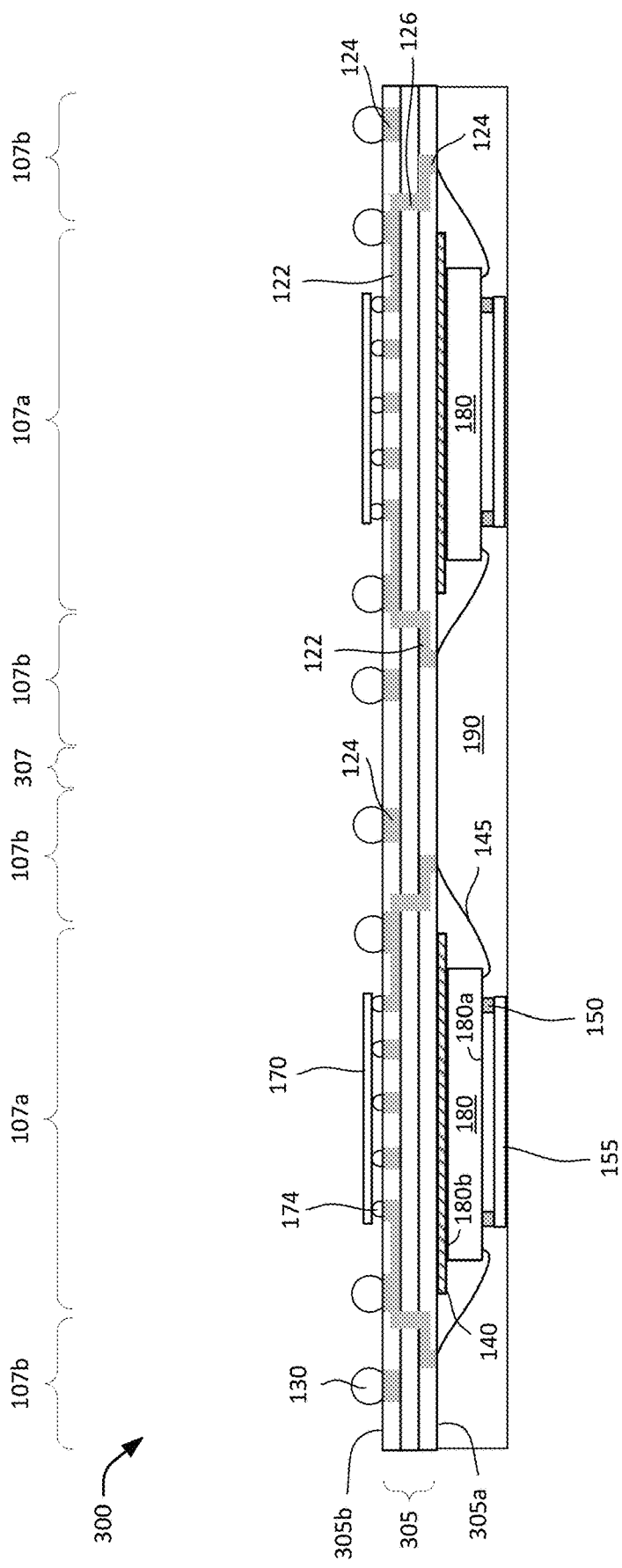

Referring to FIG. 3g, the support carrier 320 is detached from the surfaces of the encapsulant 190 and the covering member 155. In one embodiment, the process 300 includes physically pulling away (e.g., ripping) the support carrier 320 from the encapsulant 190 and covering member 155 such that there is no adhesive residue formed on the exposed surface (or top surface) of the covering member 155. For example, no cleaning step is required after removing the support carrier 320.

Figure 3H:
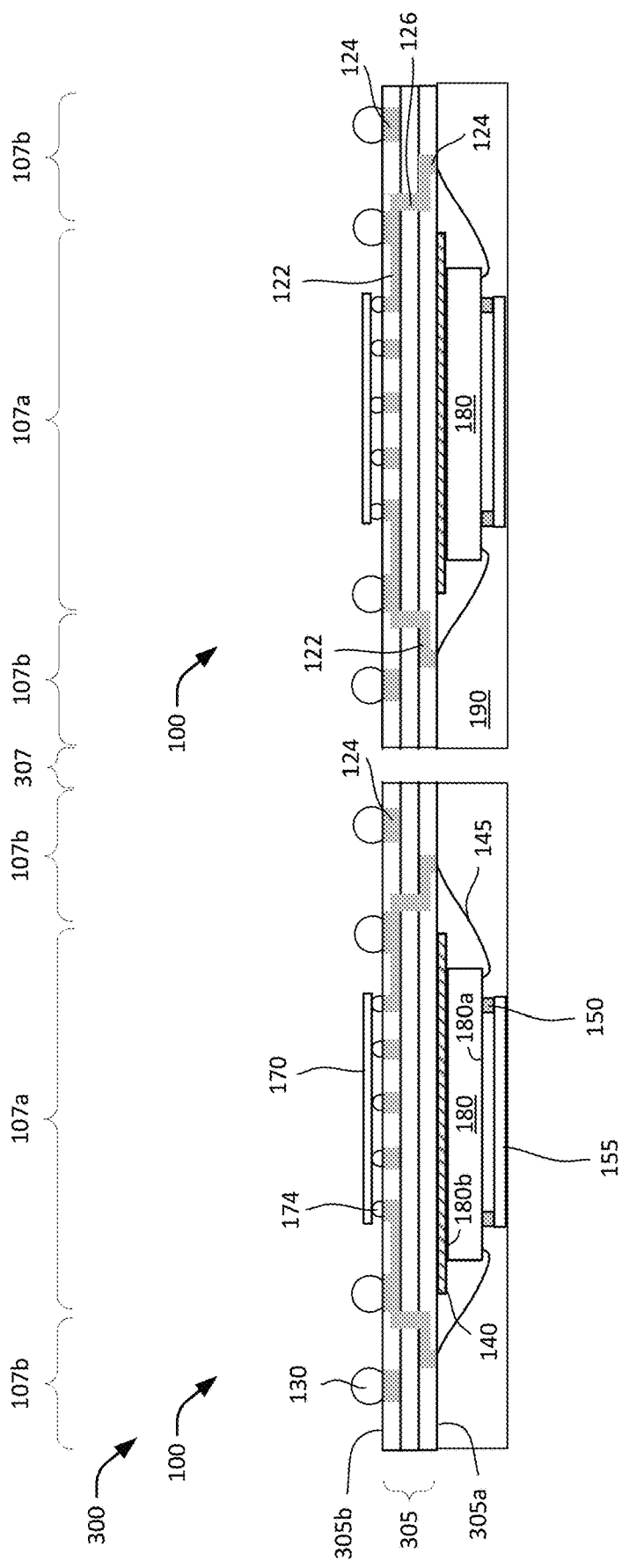
Figure 3I:
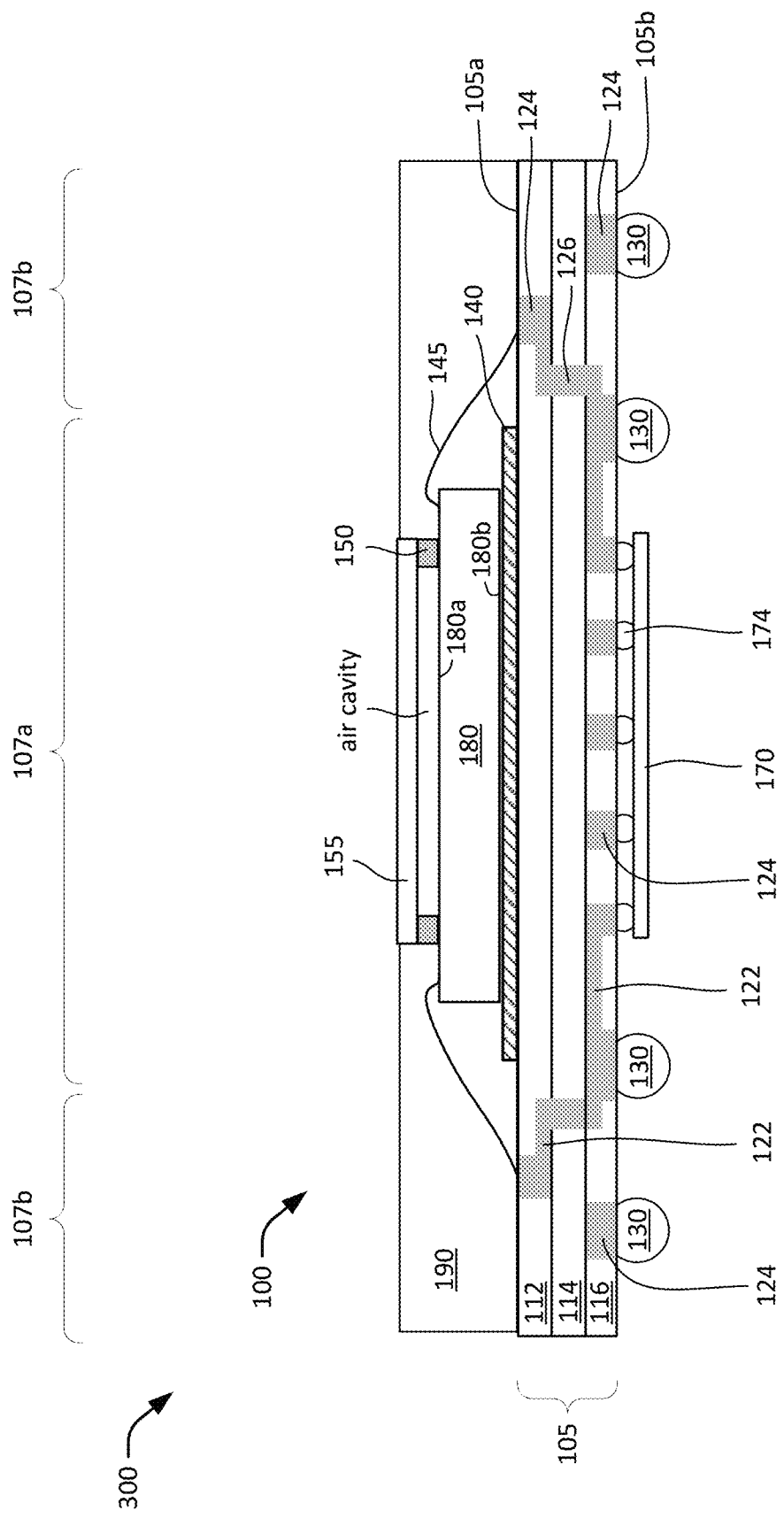

Referring to FIG. 3h, a singulation process is performed on the bottom substrate surface 305b along the inactive regions 307 of the package substrate 305. In one embodiment, the encapsulant 190 provides mechanical support for the singulation process. The package substrate 305 is, for example, singulated by sawing through the package substrate 305 and encapsulant 190 (e.g., from the bottom substrate surface 205b to the top surface of the encapsulant). Other singulation techniques, including dicing or laser cutting may also be useful. The singulation process physically separates the active regions of the package substrate 305 to form individual semiconductor packages 100, such as that described in FIGS. 1a-1c, as shown particularly in FIG. 3i.

In comparison with conventional package processes, the method of the present invention improves package substrate utilization and reduces manufacturing costs.

The inventive concept of the present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method for forming a semiconductor package comprising:
   providing a laminate package substrate having a top and a bottom non-conductive substrate layer, the top substrate layer defines a top substrate surface and the bottom substrate layer defines a bottom substrate surface of the laminate package substrate, wherein the laminate package substrate comprises a multi-layer substrate having a core substrate layer sandwiched between the top and bottom substrate layers, wherein the core layer has different material from the top and bottom substrate layers, wherein the laminate package substrate is defined with a die region and a non-die region surrounding the die region, the laminate package substrate comprises contact pads exposed in openings of the top and bottom substrate surfaces;
   mounting a sensor chip on the top substrate surface in the die region;
   electrically connecting the sensor chip to the contact pads exposed in openings of the top substrate surface;
   mounting a covering member on the sensor chip, wherein the covering member partially overlaps a peripheral region defined on a top surface of the sensor chip;
   forming an encapsulant to encapsulate the sensor chip after mounting the covering member, wherein the encapsulant covers sidewalls of the covering member and exposes a top surface of the covering member;
   attaching top surfaces of the encapsulant and covering member to a temporary carrier;
   mounting an integrated circuit on the bottom substrate surface in the die region after attaching the temporary carrier, wherein the integrated circuit is electrically coupled to the contact pads exposed in openings of the bottom substrate surface in a flip-chip manner; and
   detaching the temporary carrier from the encapsulant and covering member after the integrated circuit is mounted on the laminate package substrate.

2. The method of claim 1 comprising forming a plurality of package contacts on the bottom substrate surface in the non-die region prior to detaching the temporary carrier, wherein the plurality of package contacts are coupled to the contact pads exposed in the bottom substrate surface.

3. The method of claim 2 wherein the package contacts are metal bumps protruding from the bottom substrate surface, wherein the package contacts extend downwardly beyond the integrated circuit.

4. The method of claim 1 wherein the covering member is a transparent member, and is bonded to the top surface of the sensor chip using a UV-curable adhesive material.

5. The method of claim 4 wherein the UV-curable adhesive material forms a standoff structure between the covering member and the sensor chip, and defines an air cavity between the covering member and the sensor chip.

6. The method of claim 1 comprising electrically coupling the sensor chip to the contact pads exposed in the openings of the top substrate surface using conductive wires.

7. A method for forming a semiconductor package comprising:
providing a multi-layer package substrate, the multi-layer package substrate having a core non-conductive substrate layer sandwiched between a top non-conductive substrate layer and a bottom non-conductive substrate layer, wherein the core substrate layer has different material from the top and bottom substrate layers, the top substrate layer defines a top substrate surface and the bottom substrate layer defines a bottom substrate surface of the package substrate, wherein the package substrate is defined with a die region and a non-die region surrounding the die region, wherein the package substrate comprises a top substrate surface and a bottom substrate surface, and contact pads exposed in openings of the top and bottom substrate surfaces;
mounting a sensor chip in the die region;
electrically coupling the sensor chip to the contact pads exposed in openings of the top substrate surface;
mounting a covering member on the sensor chip, wherein the covering member partially overlaps a peripheral region defined on a top surface of the sensor chip;
forming an encapsulant to encapsulate the sensor chip after mounting the covering member, wherein the encapsulant covers sidewalls of the covering member and exposes a top surface of the covering member;
attaching top surfaces of the encapsulant and covering member to a temporary carrier; and
mounting an integrated circuit on the bottom substrate surface in the die region after attaching the temporary carrier, wherein the integrated circuit is electrically coupled to the contact pads exposed in openings of the bottom substrate surface in a flip-chip manner.

8. The method of claim 7 comprising electrically coupling the sensor chip to the contact pads exposed in the top substrate surface using conductive wires.

9. The method of claim 8 wherein the encapsulant surrounds the sensor chip, wherein the encapsulant encapsulates the conductive wires and contacts sidewalls of the covering member without overlapping the covering member.

10. The method of claim 7 wherein the integrated circuit is electrically coupled to the sensor chip, and the integrated circuit is a signal processor processing signals from the sensor chip.

11. The method of claim 7 comprises forming a plurality of package contacts on the bottom substrate surface in the non-die region, wherein the plurality of package contacts are coupled to the contact pads exposed in the bottom substrate surface, the package contacts including metallic balls arranged in the form of ball grid array for electrically coupling to a printed circuit board.

12. The method of claim 7 wherein the package substrate is a laminate substrate wherein the core substrate layer is disposed directly between the top substrate layer and the bottom substrate layer.

13. The method of claim 12 comprising disposing via contacts in the core substrate layer to interconnect conductive traces and contact pads disposed in the top and bottom substrate layers.

14. The method of claim 7 comprising disposing a UV-curable adhesive material on and extending along the peripheral region defined on the top surface of the sensor chip, wherein the UV-curable adhesive material bonds the covering member to the sensor chip.

15. The method of claim 7 wherein the sensor chip is an image sensing chip which receives optical signals through the covering member.

16. The method of claim 14 comprising forming an air cavity between the covering member and the sensor chip.

17. A method for forming a semiconductor package comprising:
providing a laminate package substrate, wherein the laminate package substrate comprises a multi-layer package substrate having a core non-conductive substrate layer sandwiched between a top non-conductive substrate layer and a bottom non-conductive substrate layer, wherein the core substrate layer has different material from the top and bottom substrate layers, the top substrate layer defines a top substrate surface and the bottom substrate layer defines a bottom substrate surface of the package substrate, wherein the package substrate is defined with a die region and a non-die region surrounding the die region, wherein the laminate package substrate comprises a top substrate surface and a bottom substrate surface, and contact pads exposed in openings of the top and bottom substrate surfaces;
mounting a sensor chip in the die region;
electrically coupling the sensor chip to the contact pads exposed in the openings of the top substrate surface;
mounting a covering member over a sensing element of the sensor chip, wherein the covering member partially overlaps a peripheral region defined on a top surface of the sensor chip;
forming an encapsulant surrounding the sensor chip, wherein the encapsulant covers sidewalls of the sensor chip and contacts sidewalls of the covering member;
forming an encapsulant to encapsulate the sensor chip after mounting the covering member, wherein the encapsulant covers sidewalls of the covering member and exposes a top surface of the covering member;
attaching top surfaces of the encapsulant and covering member to a temporary carrier; and
mounting an integrated circuit on the bottom substrate surface in the die region after attaching the temporary carrier, wherein the integrated circuit is electrically coupled to the contact pads exposed in the openings of the bottom substrate surface in a flip-chip manner.

18. The method of claim 17 wherein the sensor chip is an image sensing chip, wherein the sensing element of the image sensing chip receives optical signals through the covering member.

19. The method of claim 18 wherein the integrated circuit is a signal processor, wherein the image sensing chip transforms the optical signals received into electrical signals and transmits the electrical signals to the integrated circuit for processing.

20. The method of claim 17 wherein the covering member is bonded to the top surface of the sensor chip using a UV-curable adhesive material, wherein the UV-curable adhesive material defines an air cavity between the covering member and the sensor chip.

* * * * *